United States Patent
Hamers et al.

[11] Patent Number: 5,908,692
[45] Date of Patent: Jun. 1, 1999

[54] ORDERED ORGANIC MONOLAYERS AND METHODS OF PREPARATION THEREOF

[75] Inventors: Robert J. Hamers; Jennifer S. Hovis; Seung Y. Lee, all of Madison, Wis.

[73] Assignee: Wisconsin Alumni Research Foundation, Madison, Wis.

[21] Appl. No.: 08/786,873

[22] Filed: Jan. 23, 1997

[51] Int. Cl.[6] .................................................. B32B 15/04
[52] U.S. Cl. ........................... 428/333; 349/1; 427/399; 428/1; 428/446; 428/457
[58] Field of Search .............................. 428/1, 333, 446, 428/457; 349/1; 427/399

[56] References Cited

U.S. PATENT DOCUMENTS 5,268,621  12/1993  Hamers et al. ........................ 318/116

OTHER PUBLICATIONS

Hamers, R.J. et al. Surf. Sci., (1987), 181, pp. 346–355. Electronic and Geometric Structure of Si(111)–(7x7) and Si(001) Surfaces.
West, R., Angewandte Chemie, Int. Ed., (1987), 26, pp. 1201–1211. Chemistry of the Silicon–Silicon Double Bond.
Linford, M.R. et al. J. Am. Chem. Soc., (1995), 117, pp. 3145–3155. Alkyl Monolayers on Silicon Prepared from 1–Alkenes & Hydrogen–Terminated Silicon.
Cheng, C.C. et al. J. Appl. Phys., (1990) 67, pp. 3693–3699. Direct determination of absolute monolayer coverages of chemisorbed $C_2H_2$ & $C_2H_4$ on Si(100).
Taylor, P.A. et al. J. Amer. Chem. Soc., (1992), 114, pp. 6754–6760. Adsorption & Decomposition of Acetylene on Si(100)–(2x1).
Mayne, A.J. et al. Discussions of the Royal Society, (1992), 94, pp. 199–212.
Mayne, A.J. et al. Surf. Sci., (1993), 284, pp. 247–256. An STM study of the chemisorption of $C_2H_4$ on Si(001)(2x1).
Hamers, R.J. et al., Phys. Rev. B, (1986), 34, pp. 5343–5357. Scanning tunneling microscopy of Si(001).
Chadi, J.D., Phys. Rev. Letters, (1987), 59, pp. 1691–1694. Stabilities of Single–Layer & Bilayer Steps on Si(001) Surfaces.
Henzler, M. et al. Jpn. J. Appl. Phys. Suppl. 2, Pt. 2, (1974), pp. 389–396. Structural & Electronic Properties of Stepped Semiconductor Surfaces.
Shan J. et al. J. Phys. Chem., (1996), 100, pp. 4961–4969. Adsorption & Dissociation of Phosphine on Si(001).
Chabal, Y.J. et al. Phys. Rev. Lett., (1996), 53, No. 3, pp. 282–285. Surface Infared Study of Si(100)–(2x1) H.
Kugler, Th., et al. Mat. Sci. & Engineering, (1996) B37, pp. 112–115. Char. & simulation of organic adsorbates on the Si(100)(2x1)–surface using photoelectron spectroscopy & quantum mech. calculations.

*Primary Examiner*—D. S. Nakarani
*Attorney, Agent, or Firm*—Wilson, Sonsini, Goodrich & Rosati

[57] ABSTRACT

Systems and methods for fabricating ordered anisotropic organic monolayers are described. An apparatus includes a substrate including a surface; and an ordered organic monolayer chemically bonded to the surface, the ordered organic monolayer including a plurality of cyclic organic molecules, each of the plurality of cyclic organic molecules being obtained from an unsaturated cyclic organic reactant that is chemically bonded to the surface through an addition reaction. The systems and methods provide advantages in that translational and rotational order from the substrate is extended into the monolayer.

81 Claims, 5 Drawing Sheets

ORDERED ORGANIC MONOLAYERS AND METHODS OF PREPARATION THEREOF

STATEMENT AS TO RIGHTS TO INVENTIONS MADE UNDER FEDERALLY-SPONSORED RESEARCH AND DEVELOPMENT

This invention was made with United States government support awarded by the following agencies: Department of Defense (DOD) Grant Nos: N00014-91-J-1629 and N00014-95-1-0894; and National Science Foundation (NSF), Grant Nos: CHE-9253704; DMR-9403845; CHE-9521731. The United States has certain rights in this invention.

BACKGROUND OF THE INVENTION

1. Field of the Invention

The present invention relates generally to the field of organic thin films. More particularly, the present invention relates to organic monolayers that are formed via an addition reaction. Specifically, a preferred embodiment of the present invention relates to an organic monolayer that is formed on a silicon (001) surface with the Si=Si dimers of the surface acting as a template for extending the translational and rotational order of the surface to the organic monolayer. The present invention thus relates to organic monolayers of the type that can be termed ordered and anisotropic.

2. Discussion of the Related Art

Within this application several publications are referenced by arabic numerals within parentheses. Full citations for these, and other, publications may be found at the end of the specification immediately preceding the claims. The disclosures of all these publications in their entireties are hereby expressly incorporated by reference into the present application for the purposes of indicating the background of the present invention and illustrating the state of the art.

Historically, the (001) surface of silicon has been very important technologically as the starting point for most microelectronic devices. While microelectronics processing typically involves reactions of silicon surfaces with inorganic compounds, there has been increasing interest in developing methods for coupling existing microelectronics technology with organic-based structures for applications such as non-linear optics, thin-film displays, lithography and molecular electronics.

The Si(001) surface is characterized by a surface reconstruction in which adjacent atoms pair together, forming dimers, (i.e., Si=Si). Since each silicon atom of the bulk-terminated surface has two dangling bonds, the hybridization of two atoms to form a dimer can be described as the formation of a strong $\sigma$ bond and a weak $\pi$ bond.

Scanning tunneling microscope (STM) images of Si(001) have revealed filled and empty electronic states having the symmetry properties expected for $\pi$-type electronic states as the highest-occupied and lowest-occupied electronic states.[1] The $\pi$ bonding of Si(001) suggests that the reactions of this surface should in some way be analogous to those of double-bonded compounds of carbon and of silicon.[2]

Despite the great technological importance of the Si(001) surface, there has been comparatively little work attempting to fabricate well-defined organic layers on this surface. Chidsey and co-workers successfully formed layers of densely-packed alkyl monolayers on hydrogen-terminated Si(111) and Si(001) surfaces through a free-radical mechanism.[3] It has been observed previously that ethylene and acetylene are capable of chemisorbing on Si(001) in a so-called "di-$\sigma$" configuration, in which the double bonds of the Si dimers and the double bonds of the adsorbed organic species are broken, thereby forming two new Si—C $\pi$ bonds.[4-7] The chemical process responsible for this reaction can be formally termed a "2+2" cycloaddition reaction.

However, a disadvantage of most these previously recognized approaches is a lack of adhesion unless various chemical bonds of the reactants are broken. Typically, these prior art approaches include the breakage of carbon-hydrogen bonds, or even carbon-carbon bonds. The breakage of these bonds introduces disorder into the deposited organic film.

SUMMARY AND OBJECTS OF THE INVENTION

By way of summary, the present invention is directed to the formation of organic monolayers on a substrate through an addition reaction. An unexpected beneficial effect of the present invention, which is a substantial improvement, is to extend translational and rotational order from the substrate to the organic monolayers through the use of nonsaturated cyclic organic reactants and/or substrates in which the surface dimers are orientated a substantially identical direction.

A primary object of the invention is to provide an apparatus that includes an interface between a substrate and an ordered organic monolayer. Another object of the invention is to provide an ordered organic monolayer into which the rotational and translational order of the substrate is extended. Another object of the invention is to provide an apparatus that is cost effective. It is another object of the invention to provide an apparatus that is rugged and reliable, thereby decreasing down time and operating costs. It is yet another object of the invention to provide an apparatus that has one or more of the characteristics discussed above but which is relatively simple to fabricate using a minimum amount of equipment.

In accordance with a first aspect of the invention, these objects are achieved by providing an apparatus comprising: a substrate including a surface; and an ordered organic monolayer chemically bonded to the surface, the ordered organic monolayer including a plurality of cyclic organic molecules, each of the plurality of cyclic organic molecules being obtained from an unsaturated cyclic organic reactant that is chemically bonded to the surface through an addition reaction. In one embodiment, both a translational order and a rotational order are extended into the ordered organic monolayer from the substrate.

Another object of the invention is to provide a method that can be used to fabricate an interface between a substrate and an ordered organic monolayer. It is another object of the invention to provide a method that is predictable and reproducible, thereby decreasing variance and operating costs. It is yet another object of the invention to provide a method that has one or more of the characteristics discussed above but which is relatively simple to set up and operate using moderately skilled workers.

In accordance with a second aspect of the invention, these objects are achieved by providing a method comprising providing a substrate with a surface including a plurality of dimers, substantially all of the dimers being orientated in substantially an identical direction; providing an unsaturated organic reactant; and reacting the unsaturated organic reactant with the substrate so as to deposit an ordered organic monolayer on the surface, the ordered organic monolayer including a plurality of organic molecules, wherein reacting includes an addition reaction of the unsaturated organic reactant with the surface. In one embodiment, the method further comprises attaching a plurality of tethered objects to the organic monolayer.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

A clear conception of the advantages and features constituting the present invention, and of the construction and operation of typical mechanisms provided with the present invention, will become more readily apparent by referring to the exemplary, and therefore nonlimiting, embodiments illustrated in the drawings accompanying and forming a part of this specification, wherein like reference numerals designate the same elements in the several views, and in which:

FIGS. 1C and 1B illustrate a schematic sequential view of an insertion reaction according to the present invention;

FIG. 4C illustrates an STM image of an ordered anisotropic organic monolayer according to the present invention.

DESCRIPTION OF PREFERRED EMBODIMENTS

The present invention and the various features and advantageous details thereof are explained more fully with reference to the nonlimiting embodiments that are illustrated in the accompanying drawings and detailed in the following description. Descriptions of well known components and processing techniques are omitted so as to not unnecessarily obscure the present invention in detail.

1. System Overview

The above-mentioned requirements are mutually contradicting and cannot be satisfied simultaneously in the case of conventional thin films or deposition techniques. However, it is rendered possible to simultaneously satisfy these requirements to a certain extent by employing unsaturated organic reactants according to the present invention in consideration of the fact that the addition reaction between the double bonds present on a Si(001) surface and the double bonds present in the unsaturated organic molecules result in well-defined organic layers on the Si(001) surface in which the molecules are ordered translationally as well as rotationally. In the case where all the dimers of a surface are orientated in substantially the same direction, the bonded organic molecules will then be orientated in this direction.

The generic phrase addition reaction is defined to include both 2+2 cycloaddition reactions and insertion reactions. For the purpose of definition, the subgeneric phrase 2+2 cycloaddition reaction includes those reactions where a post-reaction bond exists between the two silicon atoms of a given dimer. A specific example of a 2+2 cycloaddition reaction is the formation of cyclobutane from two ethene molecules. For the purpose of definition, the subgeneric phrase insertion reaction includes reactions where there is no post-reaction bond between the two silicon atoms of a given dimer. The subgeneric class of insertion reaction is composed by reaction examples where, i) a post-reaction hydrogen (or other) atom is bonded to each of the two silicon atoms of a given dimer, a ii) post-reaction hydrogen (or other) atom is bonded to one of the two silicon atoms of a dimer while a post reaction dangling bond is exhibited by the other of the two silicon atoms of a given dimer, and iii) a post-reaction dangling bond is exhibited by each of the two silicon atoms of a given dimer.

While not being bound by theory, the probability of dangling bonds being exhibited may be a function of the partial pressure of hydrogen that is maintained in the ultra high vacuum during the insertion reaction. Thus, the number of dangling bonds may be increased by gettering as much hydrogen from the vacuum as possible, both before and during the insertion reaction.

2. Detailed Description of Preferred Embodiments

Referring to the drawings, it can be seen that the present invention is based on a chemical reaction between the substrate and individual precursor molecules. It should be noted that the features illustrated in the drawings are not necessarily drawn to scale.

Figure 1A:
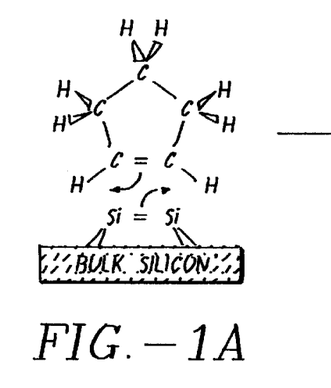
FIGS. 1A and 1B illustrate a schematic sequential view of a 2+2 cycloaddition reaction according to the present invention.
Figure 1B:
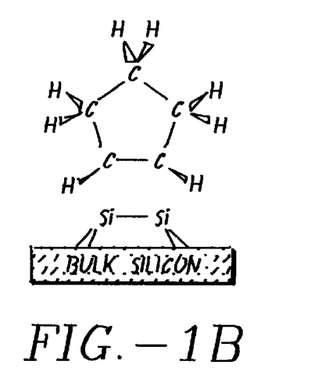

Referring to FIGS. 1A and 1B, a 2+2 cycloaddition reaction between a dimer of the Si(001) surface and a cyclopentene molecule is shown. The post-reaction bond between the silicon atoms can be seen in FIG. 1B. While cyclopentene molecules are shown as reactants in this 2+2 cycloaddition reaction, any suitable precursor molecule can be used.

Figure 1C:
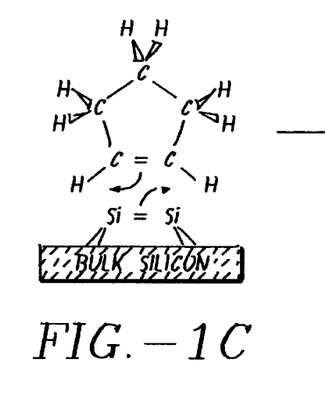
Figure 1D:
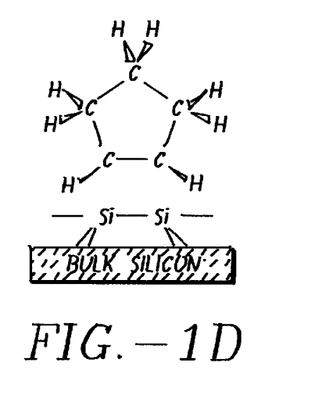

Referring to FIGS. 1C and 1D, an insertion reaction between a dimer of the Si(001) surface and a cyclopentene molecule is shown. The dangling bonds can be seen adjacent the silicon atoms in FIG. 1D. While cyclopentene molecules are shown in this insertion, any suitable precursor molecule can be used.

Referring to all of FIGS. 1A–1D, which depict cyclopentene as a prototypical example, both the 2+2 cycloaddition and insertion reactions can be used to produce a well-defined interface between a silicon surface and an organic monolayer. In either event, this layer contains molecules aligned along specific crystallographic directions with minimal dissociation. The directionality of molecular orientation can be maintained over macroscopic distances using miscut (i.e., "vicinal") Si(001) substrates. The resulting molecular orientation leads to measurable anisotropy in optical properties measured on centimeter length scales. Both the 2+2 cycloaddition reaction and the insertion reaction can be extended to other molecules, suggesting that they should provide a general method for fabrication of organic layers with controlled chemical functionality on Si(001) surfaces.

Possible substrates include Si(100)--2×1 both vicinal and 4° miscut, Ge(100)-2×1, C(100)-2×1, GaAs(100) with As—As dimers on surface, GaAs(100) with Ga—Ga dimers on surface, GaP(100) with P—P dimers on surface, GaP (100) with Ga—Ga dimers on surface. It should be noted that Si(100)-2×1 4° miscut will have all the dimers oriented in the same direction. It may well be possible to get the other surfaces, (e.g., Ge, C, GaAs, GaP), cut with all the dimers in the same direction.

Possible organic reactants include homocyclic compounds, heterocyclic compounds, bicyclic compounds and other compounds. The choice of organic reactants should be based on the presence of an unsaturated carbon-carbon bond.

Suitable homocyclic compounds include the generic groups of cyclopentene, cyclohexene, 1,3-cyclohexene, benzene, acenapthelene, bicyclo[2.2.1]hepta-2,5-diene, 1,5-cyclooctadiene and cubene. Examples of specific cyclopentenes include those compounds with a chemical group on any carbon of cyclopentene, (e.g., cyclopent-3-enol; 3-bromocyclopentene; cyclopent-3-enyl-benzene; cyclopent-3 enecarboxylic acid; 4-hex-5enyl-cyclopentene; 3-chlorocyclopentene; 4-bromo-benzesulfonicacid cyclopent-3-enyl ester; 1-hydroxymethyl-3-cyclopentene; 4-cyanocyclopentene; (3-cyclopenten-1-yl)amine; N,N-Bis<cyclopent-3-en-1-yl>harnstoff; cyclopent-3-enyl-bis-trifluoromethyl-phosphane; silylcyclopenten-3; cyclopent-3-enyl-phenyl-silane; Bis<2-(A$^3$-cyclopentenyl)-aethyl>-oxalate; napthalinsulfonsaeure-(2)-cyclopenten-(3)-yl-ester; 3-cyclopentenylmagnesiumbromide and 1-triphenylstannyl-cyclopenten-(3)-yl).

Another example of a specific suitable homocyclic compound is norbornadiene. It will be appreciated that the rotational freedom of norbornadiene yields a monolayer with translational order only.

Suitable heterocyclic compounds include the generic groups of 3-pyrroline; maleimide; 2,5-dihydrofuran; malic anhydride; vinylene carbonate; vinylene trithiocarbonate; butadienemagnesium; silacyclopent-3-ene; pyrrolin radikal; 2,5-dihydro-tellurophene and 2,5-dihydro-1H-phophole. Examples of specific 3-pyrrolines include those compounds with a chemical group on the nitrogen in 3-pyrroline (e.g., 2,5-dihydro-pyrrol-1-ol; 1-methyl-2,5-dihydropyrrole; N-formyl-2,5-dihydropyrrole; 1-benzyl-3-pyrroline; 1-(4-bromo-phenyl)-2,5-dihydro-pyrrole; tri-(3-pyrrolin-1-yl)-boron; 1-trimethylsilanyl 2,5-dihydro pyrrol; N-trilmaleimide and 1-benzenesulfonyl-2,5-dihydro-pyrrol). Examples of specific maleimides include those compounds with a chemical group on the nitrogen in maleimide such as N-phenylmaleimide.

Suitable bicyclic compounds include cis-stilbene and bicyclo[2.2.1]hepta-2,5-diene. Other suitable compounds include 1,3-butadiene; ethylene; acetylene; fumaronitrile; tetracyanotheylene and any other compound containing at least one unsaturated CC double bond, CN double bond, NN double bond, or other unsaturated bond.

While not being bound by theory, it is believed that the π bonds characteristic of the surface dimers of the reconstructed Si(001) surface can interact with π bonds of unsaturated organic molecules through a 2+2 cycloaddition reaction. Scanning tunneling microscopy (STM) studies show that the resulting layers are ordered both translationally and rotationally, with the Si=Si dimers acting as a template for extending the translational and rotational order from the silicon substrate to the organic film. STM images and infrared spectroscopy experiments show that by using a vicinal Si(001) surface having primarily double-height steps, the rotational order of the molecules can be preserved over macroscopic length scales, leading to measurable anisotropy in optical properties. Both the 2+2 cycloaddition and insertion reactions provide a general method for formation of controlled organic films on Si(001) surfaces, or any other suitable surface.

Figure 2A:
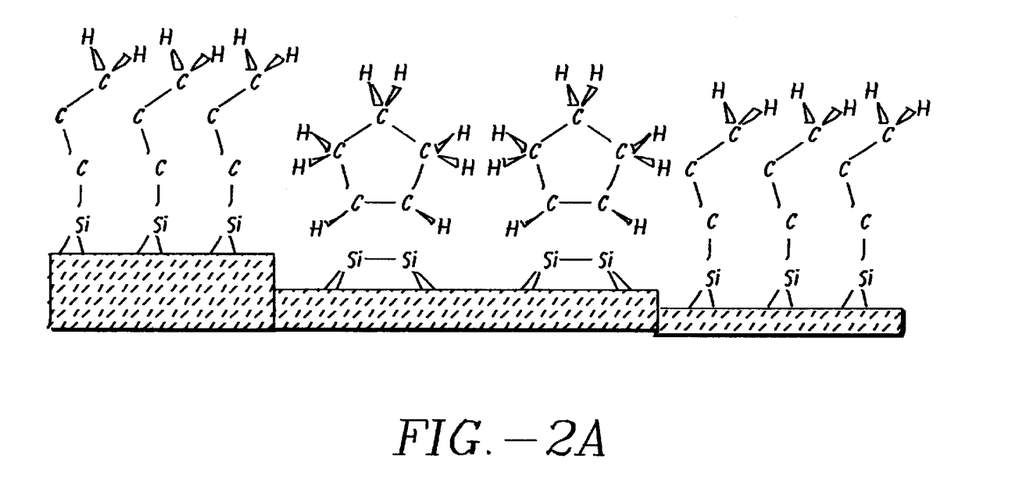
FIGS. 2A and 2B illustrate schematic cross sectional views of organic monolayers according to the present invention.
Figure 2B:
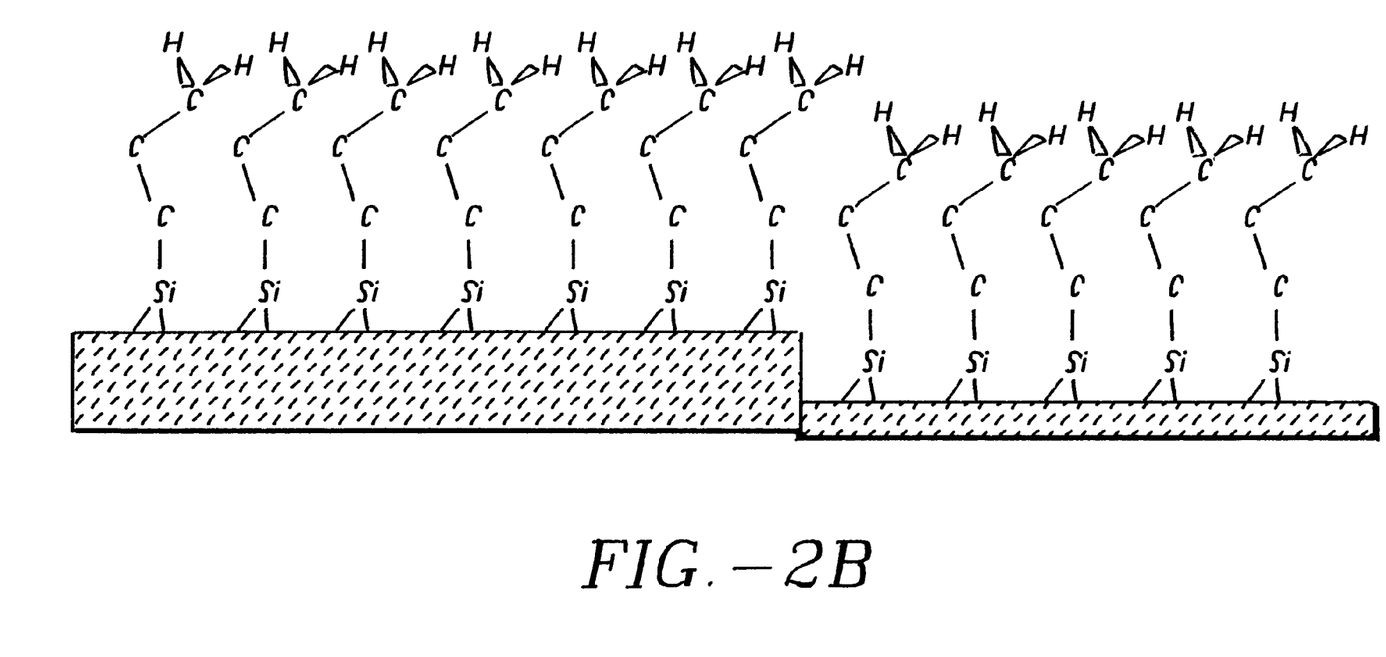

Referring to FIGS. 2A and 2B, it will be appreciated that the order of the substrate is extended into the organic monolayer. Referring to FIG. 2A, loss of long-range directionality of oriented molecules is due to bond rotations of 90° in the substrate across single-height atomic steps. However, even in this case translational order is maintained, especially within the confines of each individual step.

Referring to FIG. 2B, preservation of long-range directionality of oriented molecules over macroscopic length scales on surfaces containing double-height atomic steps is due to bond rotations of 180° across double-height atomic steps. Of course, this two-fold symmetry of the substrate steps requires the use of a reactant molecule having two-fold symmetry for the long-range directionality to be preserved in the monolayer.

The use of either the 2+2 cycloaddition reaction or the insertion reaction between the double bonds of the Si(001) surface and the double bonds of unsaturated organic compounds can be used to produce ordered, anisotropic organic layers on Si(001). Because these reactions involve covalent bonding without dissociation, they can lead to a high degree of molecular order, even at room temperature. The uniform spacing between dimers of the Si(001) surface leads to translational order of the molecular overlayer, while the inherently directional nature of the interacting π bonds translates the rotational orientation of the Si=Si dimers to the organic film. Further, the translational and rotational order of the first monolayer might be extended to subsequent layers by utilizing the directional nature of the surface bonding and/or steric interactions present at the surface.

Such well-ordered films have potential application as controlled bonding sites for linking various organic substituents to the Si(001) surface. More generally, such films can be used as arrays for tethered objects of any type. Possible tethered objects include: semiconductor nanocrystals (particularly CdS); corannulenes; fullerenes; nanotubes; biological compounds and colloids.

While not being limited to any particular diagnostic identifier, preferred embodiments of the present invention can be identified one at a time by testing for the presence of anisotropy. The test for the presence of anisotropy can be carried out without undue experimentation by the use of simple and conventional Fourier transform infrared (FTIR) absorption spectroscopy along orthogonal polarizations. Among the other ways in which to seek embodiments having the attribute of anisotropy, guidance toward the next preferred embodiment can be based on the presence of long range molecular order within the organic monolayer as evidenced by appearance as indicated by STM imaging.

EXAMPLES

Specific embodiments of the present invention will now be further described by the following, nonlimiting example which will serve to illustrate various features of significance. The example is intended merely to facilitate an understanding of ways in which the present invention may be practiced and to further enable those of skill in the art to practice the present invention. Accordingly, the example should not be construed as limiting the scope of the present invention.

All experiments reported here were performed in an ultrahigh vacuum (UHV) system that achieved a base pressure of less than $1 \times 10^{-10}$ torr. The surfaces were characterized using a number of techniques. Direct observation of adsorbed molecules and molecular layers was achieved using a UHV scanning tunneling microscope (STM). All STM images shown here were obtained with a sample bias of −3 V and a tunneling current of 0.2–0.3 nA. Fourier-transform infrared (FTIR) absorption spectra of surface layers were obtained using a multiple internal-reflection geometry and a Mattson RS-1 FTIR spectrometer coupled to the UHV system through $BaF_2$ windows. X-ray photoelectron spectroscopy (XPS) experiments were performed using a Physical Electronics system with a monochromatized aluminum Kα source. For each type of experiment, samples were prepared and characterized completely in situ.

Clean Si(001) samples were prepared by annealing pieces of Si(001) wafers to 1475 Kelvin while maintaining the chamber pressure at less than $3 \times 10^{-10}$ torr. This procedure produces clean well-ordered surfaces exhibiting a (2×1) reconstructions. Samples having two different levels of doping and two slightly different crystallographic orientations were used. Highly-doped, (<0.15 ohm-cm resistivity, Sb- and P-doped), samples were used for the STM and XPS experiments, while lightly-doped, (>5 ohm-cm resistivity, P-doped), samples were used for the FTIR spectroscopy experiments to reduce free-carrier absorption in the bulk. On-axis samples were oriented to expose the (001) surface with an accuracy ±0.5°. Off-axis (001) wafers were purposely miscut by 4.0±0.5° toward the <110> direction.

Figure 3A:
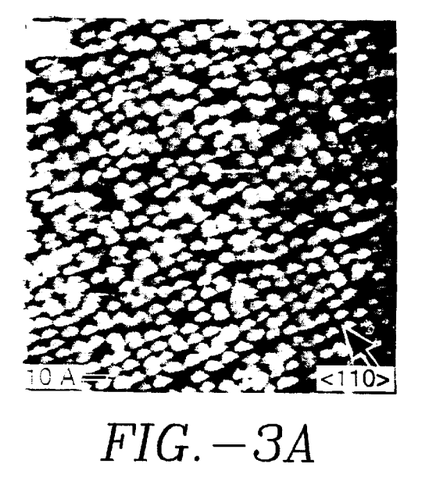
FIG. 3A illustrates a schematic isometric view of an ordered anisotropic organic monolayer according to the present invention.
Figure 3B:
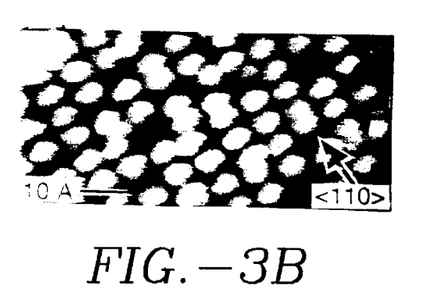
FIG. 3B illustrates absorbance as a function of frequency for the polarization directions depicted in FIG. 3A.
Figure 3C:
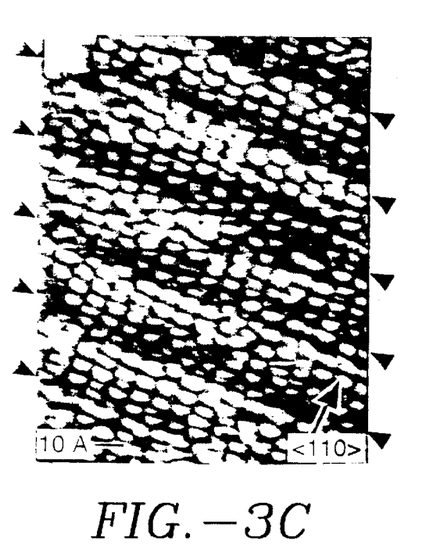

Referring to FIGS. 3A, 3B and 3C, the images are STM images of the molecular layers formed by exposure of Si(001) to cyclopentene vapor at 30 Langmuirs ($1 \times 10^{-7}$ torr for 300 sec) at room temperature, allowing the molecules to order on the surface. In FIGS. 3A and 3B the Si(001) surface was oriented to within 0.5° of the (001) plane. In contrast, in FIG. 3C the starting surface is a 4° miscut vicinal Si(001) surface.

Turning first to the on-axis sample shown in FIGS. 3A and 3B, each oval-shaped object is an individual cyclopentene molecule protruding from the surface, with the direction of elongation revealing the wide direction of the ring structure. Although in FIGS. 3A and 3B the translational ordering of the molecules on the surface is not perfect, one can clearly see two important features. First it can be seen that the molecules are aligned into rows. This demonstrates that the cyclopentene molecules spontaneously order with very specific bonding locations. Second, it can be seen that the individual molecules appear elongated and that this direction of elongation is the same for all molecules in the image. Therefore, these images prove the unexpected advantageous result that the molecules are ordered rotationally as well as translationally.

The FIG. 3A image shows an ordered molecular adsorption on a single terrace. There are long range steric interactions between the absorbed molecules. The FIG. 3B high-resolution image shows translational ordering and consistent elongated appearance of individual molecules.

In FIGS. 3A and 3B, the spacing between molecules within a given row varies, but is always an integral multiple of the 3.85 Å spacing between dimers of the Si(001) surface. Assuming no crystalline defects, the presence of some vacant sites indicates that either the surface is not completely saturated or that steric interactions prevent the molecules from completely occupying all lattice sites.

On Si(001) surfaces containing monatomic steps, the bulk of Si stacking sequence forces the Si═Si dimers on adjacent terraces at the surface to be rotated by 90°. These 90° rotations in bonding direction destroy the coherence of the molecular orientation on length scales greater than the average separation between steps. However, when Si(001) surfaces are cut by approximately 4° off the (001) plane (toward <110>), the interaction energy between steps causes the surface to adopt a configuration in which there are virtually no single-height steps; instead, the surface adopts exclusively double-height (bilayer) steps.[9,10] An important observation is that across such double-height steps the silicon dimers and the cyclopentene molecules bonded through either the 2+2 cycloaddition reaction or the insertion reaction maintain a constant rotational orientation.

Turning now to the 4°-miscut sample shown in FIG. 3C, the molecular orientation of cyclopentene is retained across double-height steps. In FIG. 3C, the arrows indicate positions of double-height atomic steps.

The STM image shown in FIG. 3C was obtained after exposure of a 4°-miscut vicinal Si(001) surface to 30 Langmuirs ($1 \times 10^{-7}$ torr for 300 seconds) cyclopentene. This grayscale image uses a mixture of height and curvature contrast to enhance visibility of the surface structure on multiple terraces. FIG. 3C shows that on vicinal samples the molecules maintain a uniform rotational orientation across the double-height steps, effectively achieving an orientation anisotropy that is consistent over the entire sample. Additionally, the molecular ordering on films on the vicinal sample is even slightly better than that on the extended Si(001) terraces, possibly because the presence of steps reduces the steric hindrance adjacent molecules.

Rotational anisotropy in the molecular orientation, as shown in FIGS. 3A–3C, is expected to lead to rotational anisotropy in optical properties such as index of refraction, reflectivity and absorption coefficients. It is also likely that in some films this could lead to anisotropy in electronic conductivity and the formation of one-dimensional conductors.

Figure 4A:
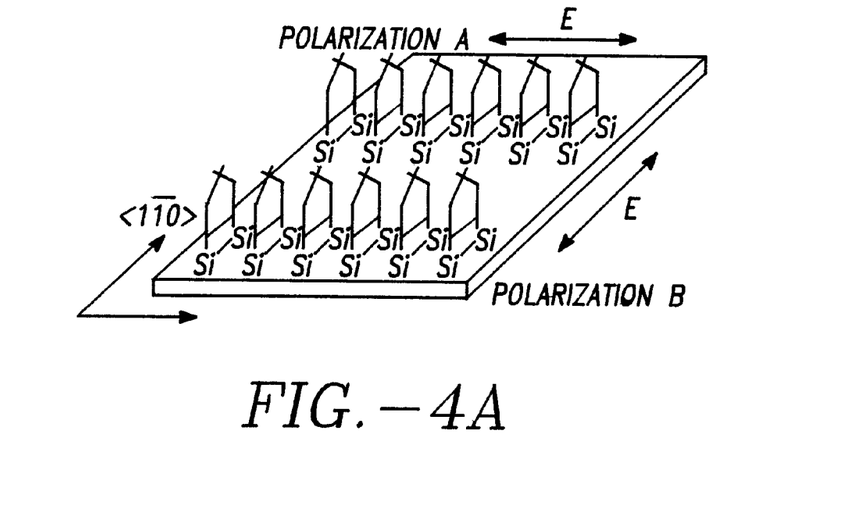
FIG. 4A illustrates a scanning tunneling microscope (STM) image of an ordered anisotropic organic monolayer according to the present invention.
Figure 4B:
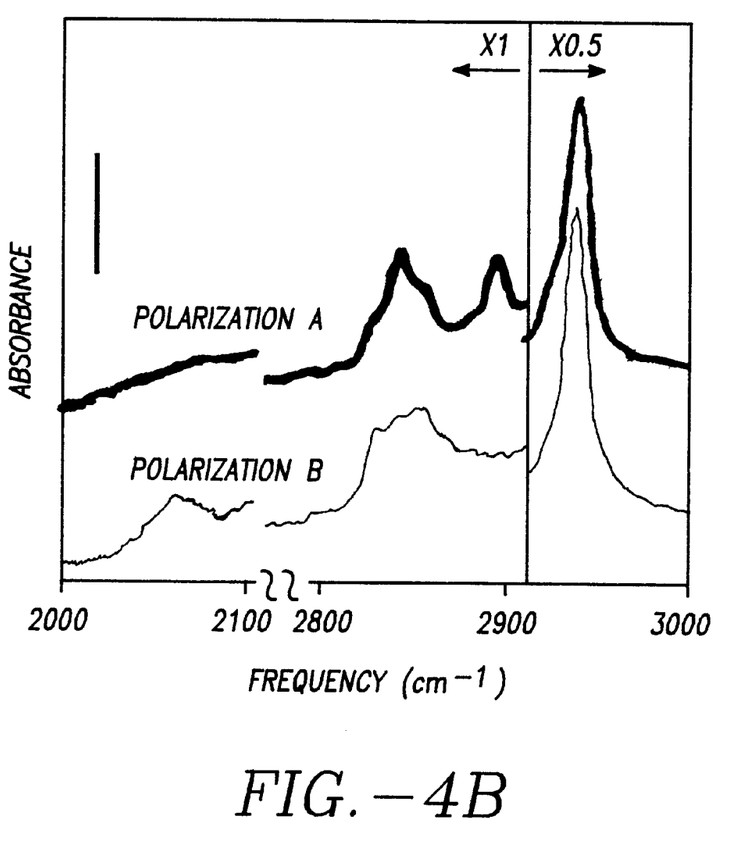
FIG. 4B illustrates an STM image of an ordered anisotropic organic monolayer according to the present invention.

To demonstrate that the molecular anisotropic orientations shown in FIG. 2B and FIG. 3C leads to measurable anisotropy in optical properties for macroscopic samples, FTIR absorption spectra for cyclopentene-exposed 4°-miscut Si(001) samples were obtained. Referring to FIGS. 4A and 4B, anisotropy of infrared absorption of cyclopentene layer on Si(001) for s-polarized light is shown.

Referring to FIG. 4A, the direction of the electric field relative to the silicon dimers for two different polarizations is schematically depicted. Polarization directions "A" and "B" both correspond to s-polarized light, but direction "A" has the electric field vector E oriented along the <110> direction, (i.e., perpendicular to the Si—Si dimer bonds), and polarization "B" has E oriented along the <110> direction, (i.e., parallel to the Si—Si dimer bonds).

Referring to FIG. 4B, S-polarized infrared absorption spectra for the two primary polarization directions defined in FIG. 4A is shown in the Si—H and C—H spectral regions. As shown in FIG. 4B, the resulting spectra in the C—H stretching region (2800–3000 $cm^{-1}$) show significant differences between the two different polarization directions. In particular, the absorption peak at 2895 $cm^{-1}$ is several times larger when measured using polarization direction "A" than with direction "B." Further, differences are observed in the relative intensities of the overlapping peaks at 2850–2875 cm$^{-1}$. Although not being bound by theory, the peak at 2895 cm$^{-1}$ can be attributed to a mode involving motion of the two H atoms at the apex of the cyclopentene molecule, (i.e., those H atoms attached to the C atom farthest from the Si surface). As indicated in FIGS. 1A–1B, 2A–2B and 4A, these C—H bonds are expected to lie in a plane perpendicular to polarization direction "B" but parallel to polarization direction "A". Most of the other C—H bonds in this molecule are expected to have components of their dynamic dipole moment along both <110> and <110> directions and to therefore show some absorption strength for both polarizations. The differences in absorption for s-polarized light along these two directions confirm that the orientation observed in the 4°-miscut STM image, (i.e., FIG. 3C), is in fact maintained over centimeter distances. Although not yet measured, it is expected that the films will also exhibit anisotropy in other optical properties such as the dielectric constant, leading to optical dichroism.

The Si—H stretching region in FIG. 4B shows a small peak near 2070 cm$^{-1}$ for polarization B. Although not being bound by theory, this peak can be attributed to the Si—H stretching mode for Si dimers with one attached hydrogen atom, suggesting that there is some dissociation on the surface.[11-12] Without being bound by theory, this dissociation may arise from impurities in the cyclopentene or may be intrinsic to the preparation procedure. Be this as it may, the small size of this peak and the ordering observed in FIG. 3C demonstrate that the extent of dissociation is small and does not significantly affect the ordering of the molecular film.

Figure 5:
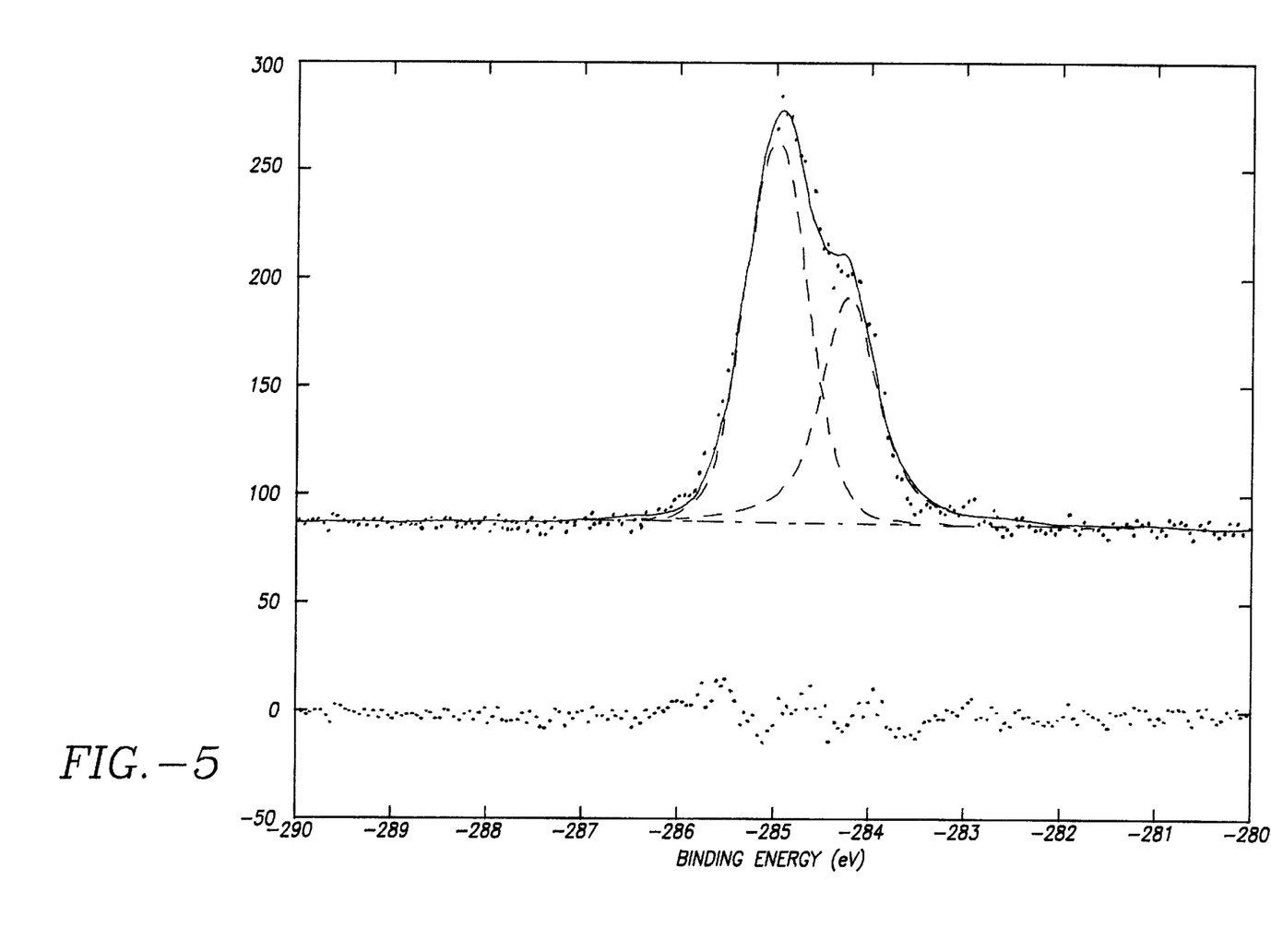
FIG. 5 illustrates electron density as a function of binding energy for an organic monolayer according to the present invention.

Referring to FIG. 5, additional characterization of the ordering of cyclopentene on the 4°-miscut surface using x-ray photoelectron spectroscopy (XPS) revealed a C1s peak with a binding energy of 284.93 eV and a smaller C1s peak at 284.18 eV. Since carbon is more electronegative than silicon, the carbon atoms bonded directly to the silicon surface are expected to be partially negatively charged and to therefore have smaller, (i.e., downfield shifted), core-level binding energies. Thus, while not being bound by theory, the peak at 284.18 eV is attributed to the carbon atoms that are bonded to the silicon surface. It will be appreciated that the ratio of peak areas $A_{284.18}/A_{284.93}$ was approximately 2:3, which is consistent with the geometry illustrated in FIGS. 1A–1B, 2A–2B and 4A.

The narrowness of the twin peaks and the absence of any other peaks in the FIG. 5 spectra is evidence of the unexpected advantageous result of the formation of an ordered organic monolayer without breaking C—C bonds, or even C—H bonds. This is in contrast to the prior art which, as noted previously, typically involves the breakage of carbon-hydrogen bonds and carbon-carbon bonds. The breakage of these bonds introduces disorder into the prior art organic films. Therefore, the degree of order exhibited by monolayers fabricated according to the present invention is unexpectedly superior, compared to the prior art.

The above experiments on cyclopentene can be extended to other unsaturated molecules as well. In preliminary experiments, we have observed formation of similar ordered structures using other unsaturated molecules including cyclohexene and the heterocyclic molecule 3-pyrroline. These formations suggest that both the 2+2 cycloaddition reaction and the insertion reaction are general methods for preparation of ordered, anisotropic organic films on Si(001), or other, surfaces.

A practical application of the present invention which has value within the technological arts is where a well defined monolayer with well defined chemistry is needed such as, for example, bimolecular sensors or lithographic resists. Another practical application of the present invention that has value within the technological arts is where a monolayer with well orientated molecules is needed such as, for example, polarization rotators, liquid crystal displays or electronic circuits with low dimensional conductors. Further, all the disclosed embodiments of the present invention are useful in conjunction with tethering objects such as CdS crystals or the like. There are virtually innumerable uses for the present invention described herein, all of which need not be detailed here.

The present invention described herein provides substantially improved results that are unexpected. All the disclosed embodiments of the invention described herein can be realized and practiced using conventional materials and components. The entirety of everything cited above or below is hereby expressly incorporated by reference.

Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept.

For example, the utility of the invention could be enhanced by providing other nonsaturated reactants that are in-turn useful for particular purposes. Similarly, although silicon is preferred for use as the substrate, any suitable material could be used in its place. In addition, the individual components need not be fabricated from the disclosed materials, but could be fabricated from virtually any suitable materials.

Moreover, the individual components need not be formed in the disclosed shapes, or assembled in the disclosed configuration, but could be provided in virtually any shape, and assembled in virtually any configuration, which interact so as to provide ordered organic monolayers. Further, although the interface described herein is a physically separate module, it will be manifest that the interface may be integrated into the apparatus with which it is associated. Furthermore, all the disclosed features of each disclosed embodiment can be combined with, or substituted for, the disclosed features of every other disclosed embodiment except where such features are mutually exclusive.

It is intended that the appended claims cover all such additions, modifications and rearrangements. Expedient embodiments of the present invention are differentiated by the appended subclaims.

REFERENCES

1. Hamers, R. J.; Tromp, R. M.; Demuth, J. E., *Electronic and Geometric Structure of Si(111)-(7×7) and Si(001) Surfaces,* Surf. Sci., (1987), 181, pages 346–355.
2. West, R., Chemistry of the Silicon-Silicon Double Bond, Angewandte Chemie, Int. Ed., (1987), 26, pages 1201–1211.
3. Linford, M. R.; Fenter, P.; Eisenberger, P. M.; Chidsey, C. E. D., *Alkyl Monolayers on Silicon Prepared from 1-Alkenes & Hydrogen-Terminated Silicon,* J. Am. Chem. Soc., (1995), 117, pages 3145–3155.
4. Cheng, C. C.; Wallace, R. M.; Taylor, P. A.; Choyke, W. J.; Yates, J. T., *Direct determination of absolute monolayer coverages of chemisorbed $C_2H_2$ & $C_2H_4$ on Si(100),* J. Appl. Phys., (1990), 67, pages 3693–3699.
5. Taylor, P. A.; Wallace, R. M.; Cheng, C. C.; Weinberg, W. H.; Dresser, M. J.; Choyke, W. J.; Yates, J. R., *Adsorption*

& *Decomposition of Acetylene on Si*(100)-(2×1)J. Amer. Chem. Soc., (1992), 114, pages 6754–6760.
6. Mayne, A. J.; Cataldi, T. R. I.; Knall, J.; Avery, A. R.; Jones, T. S.; Pinheiro, L.; Hill, H. A. O.; Briggs, G. A. D.; Pethica, J. B.; Weinberg, W. H., *Chemisorption of Organic Adsorbates on Silicon and Gold Studied by Scanning Tunnelling Microscopy*, Faraday Discussions of the Royal Society, (1992), 94, pages 199–212.
7. Mayne, A. J.; Avery, A. R.; Knall, J.; Jones, T. S.; Briggs, G. A. D.; Weinberg, W. H., *An STM study of the chemisorption of $C_2H_4$ on Si*(001) (2×1), Surf. Sci., (1993), 284, pages 247–256.
8. Hamers, R. J.; Tromp, R. M.; Demuth, J. E., *Scanning tunneling microscopy of Si*(001), Phys. Rev. B, 1986, 34, pages 5343–5357.
9. Chadi, J. D., *Stabilities of Single-Layer & Bilayer Steps on Si*(001) *Surfaces*, Phys. Rev. Letters, (1987), 59, pages 1691–1694.
10. Henzler, M.; Clabes, J., *Structural & Electronic Properties of Stepped Semiconductor Surfaces,* Jpn. J. Appl. Phys. Suppl. 2, Pt. 2, (1974), pages 389–396.
11. Shan, J.; Wang, Y.; Hamers, R. J., *Adsorption & Dissociation of Phosphine on Si*(001), J. Phys. Chem., (1996), 100, pages 4961–4969.
12. Chabal, Y. J.; Raghavachari, K., *Surface Infared Study of Si*(100)-(2×1)H, Phys. Rev. Lett., (1984), 53, No. 3, pages 282–285.
13. Kugler, Th; Ziegler, Ch; Gopel, W., *Characterization & Simulation of Organic Adsorbates on the Si*(100)(2×1)-*surface using Photoelectron Spectroscopy & Quantum Mechanical Calculations,* Materials Science and Engineering, (1996) B37, pages 112–115.
14. Douglas M. Considine et al. eds., *Van Nostrand's Scientific Encyclopedia,* 8th ed., Van Nostrand Reinhold, (1995).
15. Eugene A. Avallone et al. eds., *Mark's Standard Handbook for Mechanical Engineers,* 9th ed., McGraw Hill, (1987).
16. Richard C. Dorf et al. eds., *The Electrical Engineering Handbook,* CRC Press, (1993).
17. Robert H. Perry et al. eds., *Perry's Chemical Engineers' Handbook,* 6th ed., McGraw Hill, (1984).
18. Michael Bass et al. eds., *Handbook of Optics,* 2nd ed., Vols. I–II, McGraw Hill, (1995).
19. Martin Grayson et al. eds., *Kirk-Othmer, Concise Encyclopedia of Chemical Technology,* John Wiley & Sons, (1985).
20. David R. Lide et al. eds., *Handbook of Chemistry and Physics,* 72nd Ed., CRC Press, (1991).

What is claimed is:

1. An apparatus comprising:
    a substrate including a surface, said surface including a plurality of dimers, substantially all of said plurality of dimers being oriented in substantially an identical direction; and
    an ordered organic monolayer chemically bonded to said surface, said ordered organic monolayer including a plurality of cyclic organic molecules, each of said plurality of cyclic organic molecules being obtained from an unsaturated cyclic organic reactant that is chemically bonded to said surface through an addition reaction selected from the group consisting of 2+2 cycloaddition reactions and insertion reactions.

2. The apparatus of claim 1, wherein a translational order of said substrate is extended to each of said plurality of cyclic organic molecules.

3. The apparatus of claim 2, wherein a rotational order of said substrate is extended to each of said plurality of cyclic organic molecules.

4. The apparatus of claim 1, wherein a rotational order of said substrate is extended to each of said plurality of cyclic organic molecules.

5. The apparatus of claim 1, wherein said substrate includes at least one member selected from the group consisting of Si(100)-2×1, Ge(100)-2×1, C(100)-2×1, GaAs (100) and GaP(100).

6. The apparatus of claim 1, wherein said substrate includes at least one member selected from the group consisting of vicinal Si(100)-2×1, 4° miscut Si(100)-2×1, GaAs(100) with As—As dimers on said surface, GaAs(100) with Ga—Ga dimers on said surface, GaP(100) with P—P dimers on said surface and GaP(100) with Ga—Ga dimers on said surface.

7. The apparatus of claim 1, wherein said substrate includes 4° miscut Si(100)-2×1.

8. The apparatus of claim 1, wherein said unsaturated cyclic organic reactant includes at least one homocyclic compound selected from the group consisting of cyclopentene, cyclohexene, 1,3-cyclohexene, benzene, acenapthelene, bicyclo[2.2.1]hepta-2,5-diene, 1,5-cyclooctadiene and cubene.

9. The apparatus of claim 8, wherein said at least one homocyclic compound includes at least one compound with a chemical group on a carbon of cyclopentene selected from the group consisting of cyclopent-3-enol, 3-bromocyclopentene, cyclopent-3-enyl-benzene, cyclopent-3 enecarboxylic acid, 4-hex-5enyl-cyclopentene, 3-chlorocyclopentene, 4-bromo-benzesulfonicacid cyclopent-3-enyl ester, 1-hydroxymethyl-3-cyclopentene, 4-cyanocyclopentene, (3-cyclopenten-1-yl)amine, N,N'-Bis<cyclopent-3-en-1-yl>harnstoff, cyclopent-3-enyl-bis-trifluoromethylphosphane, silylcyclopenten-3, cyclopent-3-enyl-phenyl-silane, Bis<2-($\Delta^3$-cyclopentenyl)-aethyl>-oxalate, napthalinsulfonsaeure-(2)-cyclopenten-(3)-ylester, 3-cyclopentenylmagnesiumbromide and 1-triphenylstannyl-cyclopenten-(3)-yl.

10. The apparatus of claim 1, wherein said unsaturated cyclic organic reactant includes at least one heterocyclic compound selected from the group consisting of 3-pyrroline, maleimide, 2,5-dihydrofuran, malic anhydride, vinylene carbonate, vinylene trithiocarbonate, butadienemagnesium, silacyclopent-3-ene, pyrrolin radikal, 2,5-dihydro-tellurophene and 2,5-dihydro-1H-phophole.

11. The apparatus of claim 10, wherein said at least one heterocyclic compound includes at least one compound with a chemical group on a nitrogen of 3-pryrroline selected from the group consisting of 2,5-dihydro-pyrrol-1-ol, 1-methyl-2,5-dihydropyrrole, N-formyl-2,5-dihydropyrrole, 1-benzyl-3-pyrroline, 1-(4-bromophenyl)- 2,5-dihydro-pyrrole, tri-(3-pyrrolin-1-yl)-boron and 1-trimethylsilanyl (2,5-dihydro pyrrol, N-trilmaleimide 1-benzenesulfonyl-2,5-dihydropyrrol).

12. The apparatus of claim 10, wherein said at least one heterocyclic compound includes N-phenylmaleimide.

13. The apparatus of claim 1, wherein said unsaturated cyclic organic reactant includes at least one bicyclic compound selected from the group consisting of cis-stilbene and bicyclo[2.2.1]hepta-2,5-diene.

14. The apparatus of claim 1, further comprising a plurality of tethered objects connected to said organic monolayer.

15. The apparatus of claim 14, wherein said plurality of tethered objects include at least one member selected from the group consisting of semiconductor nanocrystals, corannulenes, fullerenes, nanotubes, biological compounds and colloids.

16. The apparatus of claim 15, wherein said semiconductor nanocrystals include CdS.

17. A method of making the apparatus of claim 1, comprising: providing said substrate; providing said unsaturated cyclic organic reactant; and depositing said organic monolayer on said substrate, wherein depositing includes said addition reaction.

18. In an electronic circuit, the improvement comprising the apparatus of claim 1.

19. In a liquid crystal display, the improvement comprising the apparatus of claim 1.

20. In a polarization rotator, the improvement comprising the apparatus of claim 1.

21. In a lithographic resist, the improvement comprising the apparatus of claim 1.

22. In a molecular sensor, the improvement comprising the apparatus of claim 1.

23. The apparatus of claim 1, wherein said substrate includes at least one member selected from the group consisting of 4° miscut Si(100)-2×1, GaAs(100) with As—As dimers on said surface GaAs(100) with Ga—Ga dimers on said surface, GaP(100) with P—P dimers on said surface and GaP(100) with Ga—Ga dimers on said surface.

24. The apparatus of claim 23, wherein said substrate includes 4° miscut Si(100)-2×1.

25. An apparatus, comprising:
a substrate including a surface including a plurality of dimers, substantially all of said plurality of dimers being oriented in substantially an identical direction; and
an ordered organic monolayer chemically bonded to said surface, said ordered organic monolayer including a plurality of organic molecules, each of said plurality of organic molecules being obtained from an unsaturated organic reactant that is chemically bonded to said surface through an addition reaction selected from the group consisting of 2+2 cycloaddition reactions and insertion reactions.

26. The apparatus of claim 25, wherein a translational order of said substrate is extended to each of said plurality of cyclic organic molecules.

27. The apparatus of claim 26, wherein a rotational order of said substrate is extended to each of said plurality of cyclic organic molecules.

28. The apparatus of claim 25, wherein a rotational order of said substrate is extended to each of said plurality of cyclic organic molecules.

29. The apparatus of claim 25, wherein said substrate includes at least one member selected from the group consisting of Si(100)-2×1, Ge(100)-2×1, C(100)-2×1, GaAs (100) and GaP(100).

30. The apparatus of claim 25, wherein said unsaturated organic reactant includes at least one homocyclic compound selected from the group consisting of cyclopentene, cyclohexene, 1,3-cyclohexene, benzene, acenapthelene, bicyclo[2.2.1]hepta-2,5-diene, 1,5-cyclooctadiene and cubene.

31. The apparatus of claim 30, wherein said at least one homocyclic compound includes at least one compound with a chemical group on a carbon of cyclopentene selected from the group consisting of cyclopent-3-enol, 3-bromocyclopentene, cyclopent-3-enyl-benzene, cyclopent-3 enecarboxylic acid, 4-hex-5enyl-cyclopentene, 3-chlorocyclopentene, 4-bromo-benzesulfonicacid cyclopent-3-enyl ester, 1-hydroxymethyl-3-cyclopentene, 4-cyanocyclopentene, (3-cyclopenten-1-yl)amine, N,N'-Bis<cyclopent-3-en-1-yl>harnstoff, cyclopent-3-enyl-bis-trifluoromethylphosphane, silylcyclopenten-3, cyclopent-3-enyl-phenyl-silane, Bis<2-($\Delta^3$cyclopentenyl)-aethyl>-oxalate, napthalinsulfonsaeure-(2)-cyclopenten-(3)-ylester, 3-cyclopentenylmagnesiumbromide and 1-triphenylstannyl-cyclopenten-(3)-yl.

32. The apparatus of claim 25, wherein said unsaturated organic reactant includes at least one heterocyclic compound selected from the group consisting of 3-pyrroline, maleimide, 2,5-dihydrofuran, malic anhydride, vinylene carbonate, vinylene trithiocarbonate, butadienemagnesium, silacyclopent-3-ene, pyrrolin radikal, 2,5-dihydro-tellurophene and 2,5-dihydro-1H-phophole.

33. The apparatus of claim 32, wherein said at least one heterocyclic compound includes at least one compound with a chemical group on a nitrogen of 3-pyrroline selected from the group consisting of 2,5-dihydro-pyrrol-1-ol, 1-methyl-2,5-dihydropyrrole, N-formyl-2,5-dihydropyrrole, 1-benzyl-3-pyrroline, 1-(4-bromophenyl)-2,5-dihydro-pyrrole, tri-(3-pyrrolin-1-yl)-boron and 1-trimethylsilanyl (2,5-dihydro pyrrol, N-trilmaleimide 1-benzenesulfonyl-2,5-dihydro-pyrrol).

34. The apparatus of claim 32, wherein said at least one heterocyclic compound includes N-phenylmaleimide.

35. The apparatus of claim 25, wherein said unsaturated organic reactant includes at least one bicyclic compound selected from the group consisting of cis-stilbene and bicyclo[2.2.1]hepta-2,5-diene.

36. The apparatus of claim 35, wherein said unsaturated organic reactant includes at least one compound selected from the group consisting of 1,3-butadiene, ethylene, acetylene, fumaronitrile and tetracyanotheylene.

37. The apparatus of claim 25, further comprising a plurality of tethered objects connected to said organic monolayer.

38. The apparatus of claim 37, wherein said plurality of tethered objects include at least one member selected from the group consisting of semiconductor nanocrystals, corannulenes, fullerenes, nanotubes, biological compounds and colloids.

39. The apparatus of claim 38, wherein said semiconductor nanocrystals include CdS.

40. A method of making the apparatus of claim 25, comprising: providing said substrate; providing said unsaturated organic reactant; and depositing said organic monolayer on said substrate, wherein depositing includes said addition reaction.

41. In an electronic circuit, the improvement comprising the apparatus of claim 25.

42. In a liquid crystal display, the improvement comprising the apparatus of claim 25.

43. In a polarization rotator, the improvement comprising the apparatus of claim 25.

44. In a lithographic resist, the improvement comprising the apparatus of claim 25.

45. In a molecular sensor, the improvement comprising the apparatus of claim 25.

46. A method, comprising: providing a substrate with a surface, said surface including a plurality of dimers, substantially all of said plurality of dimers being oriented in substantially an identical direction;
providing an unsaturated cyclic organic reactant; and
reacting said unsaturated cyclic organic reactant with said substrate so as to deposit an ordered organic monolayer on said surface, said ordered organic monolayer including a plurality of cyclic organic molecules,
wherein reacting includes an addition reaction of said unsaturated cyclic organic reactant with said surface, said addition reaction being selected from the group consisting of 2+2 cycloaddition reactions and insertion reactions.

47. The method of claim 46, further comprising extending a translational order of said substrate to each of said plurality of cyclic organic molecules.

48. The method of claim 47, further comprising extending a rotational order of said substrate to each of said plurality of cyclic organic molecules.

49. The method of claim 46, further comprising extending a rotational order of said substrate to each of said plurality of cyclic organic molecules.

50. The method of claim 46, wherein reacting includes reacting one member selected from the group consisting of compounds with a CC double bond, compounds with a CN double bond and compounds with a NN double bond with said surface.

51. The method of claim 46, wherein providing said substrate includes providing at least one member selected from the group consisting of Si(100)-2×1, Ge(100)-2×1, C(100)-2×1, GaAs(100) and GaP(100).

52. The method of claim 46, wherein providing said substrate includes providing at least one member selected from the group consisting of vicinal Si(100)-2×1, 4° miscut Si(100)-2×1, GaAs(100) with As—As dimers on said surface, GaAs(100) with Ga—Ga dimers on said surface, GaP(100) with P—P dimers on said surface and GaP(100) with Ga—Ga dimers on said surface.

53. The method of claim 52, wherein providing said substrate includes providing 4° miscut Si(100)-2×1.

54. The method of claim 46, wherein providing said unsaturated cyclic organic reactant includes providing at least one homocyclic compound selected from the group consisting of cyclopentene, cyclohexene, 1,3-cyclohexene, benzene, acenapthelene, bicyclo[2.2.1]hepta-2,5-diene, 1,5-cyclooctadiene and cubene.

55. The method of claim 54, wherein providing said at least one homocyclic compound includes providing at least one compound with a chemical group on a carbon of cyclopentene selected from the group consisting of cyclopent-3-enol, 3-bromocyclopentene, cyclopent-3-enyl-benzene, cyclopent-3 enecarboxylic acid, 4-hex-5enyl-cyclopentene, 3-chlorocyclopentene, 4-bromo-benzesulfonicacid cyclopent-3-enyl ester, 1-hydroxymethyl-3-cyclopentene, 4-cyanocyclopentene, (3-cyclopenten-1-yl) amine, N,N'-Bis<cyclopent-3-en-1-yl>harnstoff, cyclopent-3-enyl-bistrifluoromethyl-phosphane, silylcyclopenten-3, cyclopent-3-enyl-phenyl-silane, Bis<2-(Δ³-cyclopentenyl)-aethyl>-oxalate, napthalinsulfonsaeure-(2)-cyclopenten-(3)-ylester, 3-cyclopentenylmagnesiumbromide and 1-triphenylstannyl-cyclopenten-(3)-yl.

56. The method of claim 55, wherein providing said unsaturated cyclic organic reactant includes providing at least one heterocyclic compound selected from the group consisting of 3-pyrroline, maleimide, 2,5-dihydrofuran, malic anhydride, vinylene carbonate, vinylene trithiocarbonate, butadienemagnesium, silacyclopent-3-ene, pyrrolin radikal, 2,5-dihydro-tellurophene and 2,5-dihydro-1H-phophole.

57. The method of claim 56, wherein providing said at least one heterocyclic compound includes providing at least one compound with a chemical group on a nitrogen of 3-pyrroline selected from the group consisting of 2,5-dihydro-pyrrol-1-ol, 1-methyl-2,5-dihydropyrrole, N-formyl-2,5-dihydropyrrole, 1-benzyl-3-pyrroline, 1-(4-bromo-phenyl)-2,5-dihydro-pyrrole, tri-(3-pyrrolin-1-yl)-boron and 1-trimethylsilanyl (2,5-dihydro pyrrol, N-trilmaleimide 1-benzenesulfonyl-2,5-dihydropyrrol).

58. The method of claim 56, wherein providing said at least one heterocyclic compound includes providing N-phenylmaleimide.

59. The method of claim 46, wherein providing said unsaturated cyclic organic reactant includes providing at least one bicyclic compound selected from the group consisting of cis-stilbene and bicyclo[2.2.1]hepta-2,5-diene.

60. The method of claim 46, further comprising attaching a plurality of tethered objects to said organic monolayer.

61. The method of claim 60, wherein attaching said plurality of tethered objects includes attaching at least one member selected from the group consisting of semiconductor nanocrystals, corannulenes, fullerenes, nanotubes, biological compounds and colloids.

62. The method of claim 61, wherein providing said semiconductor nanocrystals includes providing CdS.

63. A product made by the method of claim 46.

64. A method, comprising:
   providing a substrate with a surface including a plurality of dimers, substantially all of said plurality of dimers being oriented in substantially an identical direction;
   providing an unsaturated organic reactant; and
   reacting said unsaturated organic reactant with said substrate so as to deposit an ordered organic monolayer on said surface, said ordered organic monolayer including a plurality of organic molecules,
   wherein reacting includes an addition reaction of said unsaturated organic reactant with said surface, said addition reaction being selected from the group consisting of 2+2 cycloaddition reactions and insertion reactions.

65. The method of claim 64, further comprising extending a translational order of said substrate to each of said plurality of cyclic organic molecules.

66. The method of claim 65, further comprising extending a rotational order of said substrate to each of said plurality of cyclic organic molecules.

67. The method of claim 64, further comprising extending a rotational order of said substrate to each of said plurality of cyclic organic molecules.

68. The method of claim 64, wherein reacting includes reacting one member selected from the group consisting of compounds with a CC double bond, compounds with a CN double bond and compounds with a NN double bond with said surface.

69. The method of claim 64, wherein providing said substrate includes providing at least one member selected from the group consisting of Si(100)-2×1, Ge(100)-2×1, C(100)-2×1, GaAs(100) and GaP(100).

70. The method of claim, 64, wherein providing said substrate includes providing at least one member selected from the group consisting of 4° miscut Si(100)-2×1, GaAs (100) with As—As dimers on said surface, GaAs(100) with Ga—Ga dimers on said surface, GaP(100) with P—P dimers on said surface and GaP(100) with Ga—Ga-dimers on said surface.

71. The method of claim 64, wherein providing said substrate includes providing 4° miscut Si(100)-2×1.

72. The method of claim 64, wherein providing said unsaturated organic reactant includes providing at least one homocyclic compound selected from the group consisting of cyclopentene, cyclohexene, 1,3-cyclohexene, benzene, acenapthelene, bicyclo[2.2.1]hepta-2,5-diene, 1,5-cyclooctadiene and cubene.

73. The method of claim 72, wherein providing said at least one homocyclic compound includes providing at least one compound with a chemical group on a carbon of cyclopentene selected from the group consisting of cyclopent-3-enol, 3-bromocyclopentene, cyclopent-3-enyl-benzene, cyclopent-3 enecarboxylic acid, 4-hex-5enyl-cyclopentene, 3-chlorocyclopentene, 4-bromo-benzesulfonicacid cyclopent-3-enyl ester, 1-hydroxymethyl-3-cyclopentene, 4-cyanocyclopentene, (3-cyclopenten-1-yl) amine, N,N'-Bis<cyclopent-3-en-1-yl>harnstoff, cyclopent-3-enyl-bis-trifluoromethyl-phosphane, silylcyclopenten-3, cyclopent-3-enyl-phenyl-silane, Bis<2-($\Delta^3$-cyclopentenyl)-aethyl>-oxalate, napthalinsulfonsaeure-(2)-cyclopenten-(3)-ylester, 3-cyclopentenylmagnesiumbromide and 1-triphenylstannyl-cyclopenten-(3)-yl.

74. The method of claim 64, wherein providing said unsaturated organic reactant includes providing at least one heterocyclic compound selected from the group consisting of 3-pyrroline, maleimide, 2,5-dihydrofuran, malic anhydride, vinylene carbonate, vinylene trithiocarbonate, butadienemagnesium, silacyclopent-3-ene, pyrrolin radikal, 2,5-dihydro-tellurophene and 2,5-dihydro-1H-phophole.

75. The method of claim 74, wherein providing said at least one heterocyclic compound includes providing at least one compound with a chemical group on a nitrogen of 3-pryrroline selected from the group consisting of 2,5-dihydro-pyrrol-1-ol, 1-methyl-2,5-dihydropyrrole, N-formyl-2,5-dihydropyrrole, 1-benzyl-3-pyrroline, 1-(4-bromo-phenyl)-2,5-dihydro-pyrrole, tri-(3-pyrrolin-1-yl)-boron and 1-trimethylsilanyl (2,5-dihydro pyrrol, N-trilmaleimide 1-benzenesulfonyl-2,5-dihydropyrrol).

76. The method of claim 74, wherein providing said at least one heterocyclic compound includes providing N-phenylmaleimide.

77. The method of claim 64, wherein providing said unsaturated organic reactant includes providing at least one bicyclic compound selected from the group consisting of cis-stilbene and bicyclo[2.2.1]hepta-2,5-diene.

78. The method of claim 64, wherein providing said unsaturated organic reactant includes providing at least one compound selected from the group consisting of 1,3-butadiene, ethylene, acetylene, fumaronitrile and tetracyanotheylene.

79. The method of claim 64; further comprising attaching a plurality of tethered objects to said organic monolayer.

80. The method of claim 79, wherein attaching said plurality of tethered objects includes attaching at least one member selected from the group consisting of semiconductor nanocrystals, corannulenes, fullerenes, nanotubes, biological compounds and colloids.

81. A product made by the method of claim 64.

* * * * *

UNITED STATES PATENT AND TRADEMARK OFFICE
CERTIFICATE OF CORRECTION

PATENT NO. : 5,908,692
DATED : June 1, 1999
INVENTOR(S) : Robert J. Hamers

It is certified that error appears in the above-identified patent and that said Letters Patent is hereby corrected as shown below:

Column 2, on or around printer line number 6, "most these" should be --most of these--.

Column 2, on or around printer line number 24, "orientated a" should be --orientated in a--.

Column 7, on or around printer line number 25, "reconstructions" should be --reconstruction--.

Signed and Sealed this

Ninth Day of November, 1999

Attest:

Q. TODD DICKINSON

Attesting Officer

Acting Commissioner of Patents and Trademarks